United States Patent [19]

Tang

[11] Patent Number: 5,554,959
[45] Date of Patent: Sep. 10, 1996

[54] LINEAR POWER AMPLIFIER WITH A PULSE DENSITY MODULATED SWITCHING POWER SUPPLY

[75] Inventor: Engne Tang, Lexington, Mass.

[73] Assignee: VAC-com, Inc., Lexington, Mass.

[21] Appl. No.: 329,078

[22] Filed: Oct. 25, 1994

[51] Int. Cl.$^6$ ....................................................... H03F 3/04
[52] U.S. Cl. ............................ 330/297; 330/202; 330/267
[58] Field of Search ..................................... 330/123, 137, 330/202, 267, 273, 297

[56] References Cited

U.S. PATENT DOCUMENTS 4,507,619  3/1985  Dijkstra et al. ........................ 330/297

*Primary Examiner*—James B. Mullins
*Attorney, Agent, or Firm*—Pandiscio & Pandiscio

[57] ABSTRACT

A linear power amplifier having a pulse density modulated switching power supply comprising: power supply means for connection to a source of electrical power and adapted to provide (i) a first, relatively high DC voltage, and (ii) a second, relatively low DC voltage; voltage amplifying means for connection to a signal source and adapted to amplify a first, relatively low voltage signal received from the signal source into a second, relatively high voltage signal; current amplifying means connected to the voltage amplifying means and adapted to increase the current flow of the second, relatively high voltage signal, as needed, in order to properly drive a load, wherein the current amplifying means are normally powered by the second, relatively low DC voltage supplied by the power supply means; and pulse generating means connected to the line carrying the second, relatively high voltage signal to the load, and to the line supplying power to the current amplifying means, the pulse generating means being adapted to (i) compare the instantaneous voltage amplitude of the second, relatively high voltage signal with the level of the voltage powering the current amplifying means, and (ii) provide fixed duration pulses, at the first, relatively high DC voltage, to power the current amplifying means whenever, and so long as, the voltage amplitude of the second relatively high voltage signal rises high enough relative to the level of the voltage powering the current amplifying means to cause the current amplifying means to approach saturation.

15 Claims, 9 Drawing Sheets

LINEAR POWER AMPLIFIER WITH A PULSE DENSITY MODULATED SWITCHING POWER SUPPLY

FIELD OF THE INVENTION

This invention relates to amplifiers in general, and more particularly to linear power amplifiers.

BACKGROUND OF THE INVENTION

Linear power amplifiers are well known in the art. In general, these devices serve to provide voltage gain and/or current gain to a relatively low level input signal. Linear power amplifiers have had a wide variety of applications, such as servo-control, cathode ray tube deflection, audio frequency signal amplification, electric motor drivers, etc. Unfortunately, many prior art linear power amplifiers suffer from various deficiencies, including high power consumption and high heat generation.

Many prior art linear power amplifiers utilize a multi-stage design. First, the low level input signal (e.g. from a microphone amplifier, a CD player, a computer sound card, etc.) is fed into a voltage amplifier. The low level input signal experiences a voltage gain when it passes through the voltage amplifier. The voltage-amplified signal is then passed through a current amplifier. The signal experiences a current gain when it passes through the current amplifier. The voltage-amplified and current-amplified signal is then applied to a load such as a loudspeaker.

With prior art linear power amplifiers of this sort, it has been found that so long as the voltage amplitude of the signal being applied to the current amplifier remains below a certain level vis-a-vis the voltage powering the current amplifier, the current amplifier will not saturate and it will be able to power the load without degradation of the signal. However, when the voltage amplitude of the signal being applied to the current amplifier rises high enough relative to the level of the voltage powering the current amplifier, the current amplifier will saturate, thus clipping the signal voltage and limiting the current output to the load.

Typically, this problem is avoided by simply boosting the level of the voltage powering the current amplifier so as to eliminate clipping. Unfortunately, this solution has the effect of increasing the power consumed by the linear power amplifier and, consequently, increasing the heat generated by the various amplifier components. This in turn results in the need to apply additional heat sinks to the linear power amplifier, thus increasing size and cost.

Other prior art power amplifiers have been proposed to minimize the foregoing problems associated with linear power amplification. For example, in U.S. Pat. No. 4,042,890 issued Aug. 16, 1977 to Eckerle, a power amplifier is disclosed which uses a signal processor to control the state of a controllable switch, which in turn gates the output of a source of relatively high AC voltage. The Eckerle amplifier can be used to drive a wide variety of loads. However, this type of circuit also requires intermediate analog-to-digital conversion of the original signal, thus adding to complexity.

OBJECTS OF THE INVENTION

Accordingly, one object of the present invention is to provide an improved linear power amplifier.

Another object of the present invention is to provide a linear power amplifier that provides a desired increase in power with relatively low heat generation.

Yet another object of the present invention is to provide a linear power amplifier that provides a desired increase in power with very low noise, particularly at low input signal levels.

Another object of the present invention is to provide a switching power supply that provides power to its associated linear power amplifier at a very high speed, whereby the amplifier can provide power to a dynamic load at a very high speed.

And another object of the present invention is to provide a linear power amplifier having a pulsed power supply, wherein the pulses have a fixed time duration, i.e., a fixed width.

Yet another object of the present invention is to provide a linear power amplifier having a pulsed power supply, wherein the pulses have a fixed amplitude.

Still another object of the present invention is to provide a linear power amplifier having a pulsed power supply, wherein the pulses are generated in accordance with the instantaneous voltage amplitude of the signal being applied to the load, and hence in accordance with the power to be consumed by that load.

A further object of the present invention is to provide a linear power amplifier having a pulsed power supply, wherein the density of the pulses (i.e., the frequency of the pulses) varies in accordance with the instantaneous voltage amplitude of the signal being applied to the load, and hence in accordance with the power to be consumed by that load.

Still another object of the present invention is to provide a linear power amplifier having a pulsed power supply, wherein the pulsed power supply is capable of delivering in excess of one million pulses per second.

And another object of the present invention is to provide a linear power amplifier that includes a pulsed power supply and has a very high signal-to-noise ratio.

Yet another object of the present invention is to provide a linear power amplifier that includes a switching power supply and has zero switching noise at low input signal levels.

A still further object of the present invention is to provide a linear power amplifier having very low harmonic distortion over the entire audio frequency bandwidth and at various power output levels.

And another object of the present invention is to provide a linear power amplifier that provides linear power amplification with improved power efficiency.

A further object of the present invention is to provide a linear power amplifier that is particularly well adapted for audio frequency applications.

Another object of the present invention is to provide an improved method for amplifying a voltage-varying signal.

SUMMARY OF THE INVENTION

These and other objects of the present invention are achieved through the provision and use of a novel linear power amplifier having a pulse density modulated switching power supply.

More particularly, the linear power amplifier generally comprises power supply means, voltage amplifying means, current amplifying means and pulse generating means.

The power supply means are adapted to provide (i) a first, relatively high DC voltage, and (ii) a second, relatively low DC voltage.

The voltage amplifying means are connected to a signal source. The voltage amplifying means are adapted to amplify a first, relatively low voltage signal received from the signal source into a second, relatively high voltage signal. The voltage amplifying means are powered by the first, relatively high DC voltage supplied by the power supply means.

The current amplifying means are connected between the voltage amplifying means and the load. The current amplifying means are adapted to boost the current flow of the second, relatively high voltage signal received from the voltage amplifying means, as needed, in order to properly drive the load. The current amplifying means are normally powered by the second, relatively low DC voltage supplied by the power supply means.

The pulse generating means are connected to the line carrying the second, relatively high voltage signal to the load, and to the line supplying power to the current amplifying means. The pulse generating means are adapted to (i) compare the instantaneous voltage amplitude of the second, relatively high voltage signal with the level of the voltage powering the current amplifying means, and (ii) provide fixed duration pulses (at the first, relatively high DC voltage) to power the current amplifying means whenever, and so long as, the voltage amplitude of the second, relatively high voltage signal rises high enough vis-a-vis the level of the voltage powering the current amplifying means to cause the current amplifying means to approach saturation. Preferably, the pulse generating means are adapted to provide the pulses of first, relatively high DC voltage in sufficient number and with sufficient frequency, and the level of the first, relatively high DC voltage is selected so as to be high enough relative to the voltage amplitude of the second, relatively high voltage signal, to prevent the current amplifying means from ever reaching saturation. In this way the current amplifying means will be powered by the second, relatively low DC voltage so long as that low DC voltage is adequate to properly power the current amplifying means, yet will receive pulses of the first, relatively high DC voltage from the pulse generating means whenever, and so long as, those pulses are needed to keep the current amplifying means from saturating.

In the preferred embodiment of the invention, the power supply means comprise a conventional interconnection to a source of AC or DC voltage. The power supply means may comprise either a single polarity power supply or a dual polarity power supply.

The voltage amplifying means comprise any of the many linear voltage amplifiers well known in the art.

The current amplifying means comprise any of the many current-gain output transistors well known in the art for driving various loads such as complex reactance loads or loads with characteristics that change with frequency.

The pulse generating means of the present invention comprise a high speed switch, a power switch, a compensation network and a pulse filter.

More particularly, the high speed switch is adapted to monitor the voltage differential between (i) the second, relatively high voltage signal generated by the voltage amplifying means, and (ii) the input powering the current amplifying means. The high speed switch is adapted to change states when the voltage amplitude of the second, relatively high voltage signal rises high enough vis-a-vis the level of the voltage powering the current amplifying means to cause the current amplifying means to approach saturation. The high speed switch is chosen so that it will change states before the current amplifying means reach saturation, whereby clipping of the signal will be avoided.

The power switch is adapted to provide high voltage pulses to power the current amplifying means in response to a change in state of the high speed switch. In particular, the power switch is adapted to provide high voltage pulses to the current amplifying means whenever the high speed switch senses that the current amplifying means are approaching saturation.

The compensation network is disposed between (i) the voltage amplifying means, and (ii) the high speed switch. The compensation network comprises appropriately chosen resistor and capacitor components for (i) correcting for unwanted phase shifts induced by the pulse generating means, and (ii) conditioning one of the inputs to the high speed switch (i.e., the second, relatively high voltage signal generated by the voltage amplifying means) so that the high speed switch will fire at the proper moment.

The pulse filter is connected between the output of the power switch and the power input of the current amplifying means so as to condition the waveform of the high voltage pulse provided by the pulse generating means prior to the application of that pulse to the current amplifying means.

In an alternative embodiment of the present invention, the pulse generating means comprise a voltage monitor with bi-state impedance, a high speed switch, a power switch, a compensation network and a pulse filter.

The voltage monitor with bi-state impedance is used to monitor the voltage differential between (i) the second, relatively high voltage signal generated by the voltage amplifying means, and (ii) the input powering the current amplifying means. The voltage monitor with bi-state impedance is adapted to change its state of impedance when the voltage amplitude of the second, relatively high voltage signal rises high enough vis-a-vis the level of the voltage powering the current amplifying means to cause the current amplifying means to approach saturation. The voltage monitor with bi-state impedance is chosen so that it will change states before the current amplifying means reach saturation, whereby clipping of the signal will be avoided.

The high speed switch is adapted to be responsive to a change in the impedance state of the volt age monitor.

The power switch is adapted to provide high voltage pulses to power the current amplifying means in response to a change in state of the high speed switch. In particular, the power switch is adapted to provide high voltage pulses to the current amplifying means whenever the voltage monitor with bi-state impedance determines that the current amplifying means are approaching saturation.

The compensation network is disposed between (i) the voltage amplifying means, and (ii) the voltage monitor with bi-state impedance and the high speed switch. The compensation network comprises appropriately chosen resistor and capacitor components so as to provide bias to the voltage monitor with bi-state impedance and so as to set the operating point of the high speed switch. Furthermore, the compensation network corrects for unwanted phase shifts induced by the pulse generating means and prepares the high speed switch for firing at the proper moment.

The pulse filter is connected between the output of the power switch and the power input of the current amplifying means so as to condition the waveform of the high voltage pulse provided by the pulse generating means prior to application of that pulse to the current amplifying means.

BRIEF DESCRIPTION OF THE DRAWINGS

These and other objects, features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
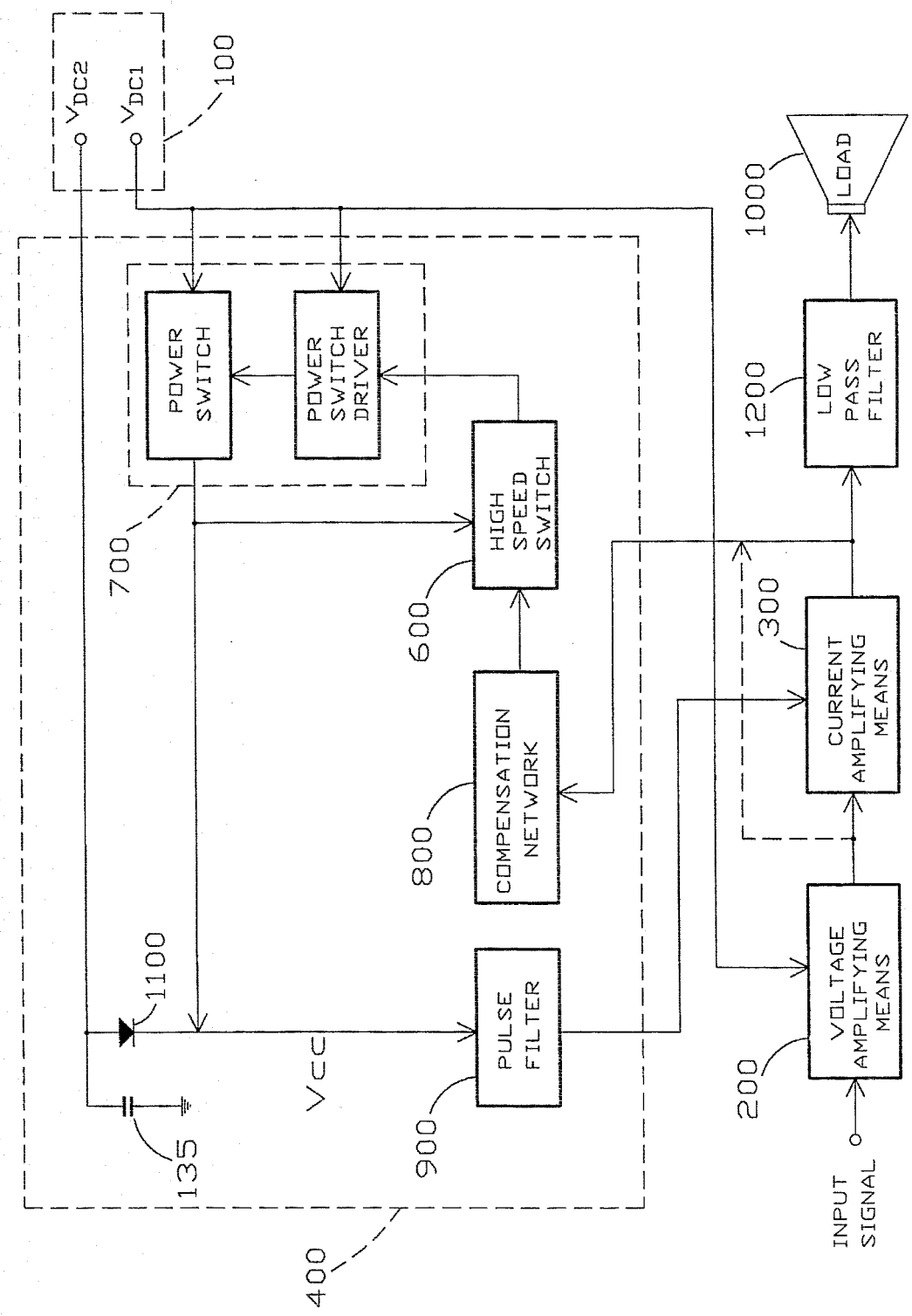
FIG. 1 is a block diagram of a preferred embodiment of a linear power amplifier with a pulse density modulated switching power supply formed in accordance with the present invention.

Referring first to FIG. 1, the preferred embodiment of the present invention generally comprises power supply means 100, voltage amplifying means 200, current amplifying means 300 and pulse generating means 400.

Pulse generating means 400 in turn generally comprise a high speed switch 600, a power switch 700, a compensation network 800 and a pulse filter 900.

Power supply means 100 may comprise either a single polarity or a dual polarity electrical power supply. For example, the AC voltage provided by a conventional power main, or a DC voltage source, may be used with the present invention. In a preferred embodiment, a dual polarity power source (see, for example, FIG. 2) is utilized to provide four output voltages, i.e., the (+) and (−) of a first, relatively high DC voltage (hereinafter referred to as $V_{DC1}$) and the (+) and (−) of a second, relatively low DC voltage (hereinafter referred to as $V_{DC2}$)

$V_{DC1}$ is the supply voltage that powers voltage amplifying means 200 so as to provide high voltage swing to drive current amplifying means 300, as will hereinafter be disclosed in further detail. $V_{DC1}$ is also the supply voltage that powers current amplifying means 300 when pulse generating means 400 supply a power pulse to current amplifying means 300, as will hereinafter be discussed in further detail.

$V_{DC2}$ is the supply voltage that normally powers current amplifying means 300, except for when pulse generating means 400 are supplying a power pulse (of fixed duration and at the voltage level $V_{DC1}$) to current amplifying means 300, as will hereinafter be discussed in further detail.

Stated another way, (+) and (−) $V_{cc}$ is the supply voltage (hereinafter referred to simply as $V_{cc}$) that powers current amplifying means 300 through pulse filter 900 of the linear power amplifier. $V_{cc}$ is normally equal to the second, relatively low DC voltage $V_{DC2}$. However, $V_{cc}$ may be increased to $V_{DC1}$ by pulse generating means 400 when the same is required in order to keep current amplifying means 300 out of saturation. In this way the linear power amplifier can always fully power a load 1000 (e.g. a loudspeaker), without any clipping of the signal, as will hereinafter be disclosed in further detail.

Preferably $V_{DC1}$ is chosen so as to be high enough, relative to the maximum anticipated voltage amplitude of the second, relatively high voltage signal, to prevent current amplifying means 300 from ever reaching saturation when current amplifying means 300 are powered by $V_{DC1}$. The maximum anticipated voltage amplitude is normally determined by the maximum output power of an amplifier, as stated by a manufacturer for commercial purposes. At the same time, however, $V_{DC1}$ is also chosen so as to apply no more voltage to current amplifying means 300 than is absolutely necessary in order to fully power load 1000.

Preferably $V_{DC2}$ is chosen so as to be high enough, relative to the maximum anticipated voltage amplitude of the second, relatively high voltage signal, to be able to power current amplifying means 300 a good deal of the time without saturation occurring. At the same time, however, for reducing the power dissipation of the current amplifying means, $V_{DC2}$ is also chosen so as to be low enough to apply as little voltage as possible to current amplifying means 300 when powering load 1000.

It will be understood by those skilled in the art that in the following circuits, the various components may be arranged so as to operate at (+) $V_{DC1}$ and (+) $V_{DC2}$, or to operate at (−) $V_{DC1}$ and (−) $V_{DC2}$, or both. For simplicity of description, the circuits of the present invention will hereinafter generally be discussed in terms of single polarity, positive voltages. It should be understood, however, that the scope of the present invention extends to various circuits of the type described, operating on either positive or negative voltages, or both.

Voltage amplifying means 200 comprise a sensitive, high gain voltage amplification circuit. In the preferred embodiment, voltage amplifying means 200 are adapted to provide low noise voltage amplification of audio-frequency signals received from an audio device, e.g. from a microphone amplifier, a CD player, a computer sound card, etc. Voltage amplifying means 200 are powered by $V_{DC1}$.

Current amplifying means 300 comprise current gain transistors or the like that are driven by the output of voltage amplifying means 200. Current amplifying means 300 are adapted to boost the current flow of the second, relatively high voltage signal received from voltage amplifying means 200, as needed, in order to properly drive load 1000. Current amplifying means 300 are normally powered by $V_{DC2}$, except for when pulse generating means 400 are supplying a power pulse (of fixed duration and at the voltage level $V_{DC1}$), as will hereinafter be discussed in further detail.

Pulse generating means 400 are connected to the output of current amplifying means 300 (or, if preferred, to the output of voltage amplifying means 200). Pulse generating means 400 (i) compare the instantaneous voltage amplitude of the second, relatively high voltage signal with the level of the voltage powering current amplifying means 300, and (ii) provide fixed duration pulses (at the high voltage $V_{DC1}$) whenever, and so long as, the voltage amplitude of the second, relatively high voltage signal rises high enough vis-a-vis the level of the voltage powering current amplifying means 300 to cause the current amplifying means to approach saturation.

To this end, pulse generating means 400 comprise a high speed switch 600 which is adapted to cycle between of two distinct states. More particularly, high speed switch 600 comprises a first state corresponding to a switch "off" position which is maintained so long as the amplitude of the second, relatively high voltage signal remains sufficiently far below the voltage of the input powering current amplifying means 300 to keep the current amplifying means out of saturation. In other words, high speed switch 600 is adapted to remain in its "off" position so long as the difference between (i) the voltage amplitude of the output of current amplifying means 300 (or voltage amplifying means 200) and (ii) the level of the voltage powering current amplifying means 300 (i.e., $V_{CC}$) is greater than or equal to some predetermined value, where that predetermined value is carefully chosen to ensure that current amplifying means 300 remain out of saturation.

High speed switch 600 further comprises a second state corresponding to a switch "on" position which is induced when the amplitude of the second, relatively high voltage signal rises high enough relative to the voltage of the input powering current amplifying means 300 to cause the current amplifying means to approach saturation. In other words, high speed switch 600 will switch to its "on" position when the difference between (i) the voltage amplitude of the output of current amplifying means 300 (or voltage amplifying means 200) and (ii) the level of the voltage powering current amplifying means 300 (i.e., $V_{CC}$) is less than the aforementioned predetermined value. Again, this aforementioned predetermined value is carefully selected so as to ensure that current amplifying means 300 remain out of saturation.

High speed switch 600 in turn actuates a power switch 700 when high speed switch 600 changes from its first "off" state to its second "on" state. Power switch 700 is adapted to switch $V_{CC}$ rapidly between $V_{DC2}$ and $V_{DC1}$ in response to each cycle of high speed switch 600. To this end, power switch 700 is also capable of being in one of two states. The first state corresponds to a switch "off" position. Power switch 700 is maintained in its first "off" state while high speed switch 600 is in its first "off" state. When power switch 700 is in its first "off" state, $V_{DC1}$ is obstructed and $V_{CC}$ is set at $V_{DC2}$.

Power switch 700 also comprises a second, "on" state. Power switch 700 will assume its second "on" state when high speed switch 600 cycles to its second "on" state. In its second "on" state, power switch 700 causes $V_{CC}$ to rise rapidly to $V_{DC1}$, with high speed diode 1100 (FIGS. 1 and 4) receiving a reverse bias so as to isolate $V_{DC2}$.

A compensation network 800 is disposed between (i) voltage amplifying means 200, and (ii) high speed switch 600. Preferably compensation network 800 is disposed between current amplifying means 300 and high speed switch 600. Compensation network 800 comprises appropriately chosen resistor and capacitor components for (i) correcting for unwanted phase shifts induced by pulse generating means 400, and (ii) conditioning one of the inputs to high speed switch 600 (i.e., the second, relatively high voltage signal generated by voltage amplifying means 200) so that the high speed switch will fire at the proper moment.

A pulse filter 900 is used to condition the waveform of the high voltage pulse provided by pulse generating means 400 prior to the application of that pulse to current amplifying means 300.

Still referring to FIG. 1, the preferred embodiment of the linear power amplifier with pulse density modulated power supply operates as follows. A first, relatively low voltage signal is received by voltage amplifying means 200. Voltage amplifying means 200 amplify this first, relatively low voltage signal into a second, relatively high voltage signal. Voltage amplifying means 200 are powered by $V_{DC1}$, and provide all of the voltage gain applied to the low level signal prior to driving load 1000. The output of voltage amplifying means 200 is applied to current amplifying means 300 so as to power load 1000, via low pass filter 1200.

As this is occurring, pulse generating means 400 continuously compare the instantaneous voltage amplitude of the output signal of current amplifying means 300 (or voltage amplifying means 200) with the level of the voltage powering current amplifying means 300. More particularly, the instantaneous voltage amplitude of the output signal of current amplifying means 300 (or voltage amplifying means 200) is continuously compared with the level of the voltage powering current amplifying means 300 (i.e., $V_{CC}$) via high speed switch 600. As long as the difference between the two voltage levels remains greater than or equal to some predetermined value (i.e., a value sufficient to ensure that current amplifying means 300 are not approaching saturation), high speed switch 600 will remain in its first "off" state. As a result, power switch 700 will also remain in its first "off" state and $V_{CC}$ will remain at $V_{DC2}$. Thus, current amplifying means 300 will be powered by the lower voltage $V_{DC2}$ as long as this lower voltage $V_{DC2}$ is sufficient to keep current amplifying means 300 out of saturation.

If, however, the instantaneous voltage amplitude of the output signal of current amplifying means 300 (or voltage amplifying means 200) rises high enough relative to the voltage of the input powering current amplifying means 300 to cause the current amplifying means to approach saturation, high speed switch 600 will immediately change state, from its first "off" state to its second "on" state. As soon as high speed switch 600 changes state, from "off" to "on", power switch 700 also changes state, from "off" to "on". This causes $V_{CC}$ to instantaneously rise from its normal $V_{DC2}$ level to the higher voltage level $V_{DC1}$. As a result, current amplifying means 300 will be powered by the higher voltage $V_{DC1}$ so as to keep current amplifying means 300 out of saturation.

As soon as $V_{CC}$ rises to $V_{DC1}$, however, the voltage difference across high speed switch 600 will once again exceed the aforementioned predetermined value tested for by high speed switch 600. As a result, high speed switch 600 will immediately switch back from its second "on" state to its first "off" state, thereby causing power switch 700 to also immediately switch back from its second "on" state to its first "off" state. Accordingly, $V_{CC}$ immediately settles toward $V_{DC2}$. In essence, then, as soon as the circuit turns itself on so as to raise $V_{CC}$ to $V_{DC1}$, the circuit also starts to turn itself off so as to restore $V_{CC}$ toward $V_{DC2}$. Thus a power pulse of very short duration and fixed amplitude $V_{DC1}$ is created whenever the voltage amplitude of the second, relatively high voltage signal rises high enough vis-a-vis the level of the voltage powering current amplifying means 300 to cause the current amplifying means to approach saturation.

The system then immediately and continuously repeats the foregoing process over and over again to determine if and when another power pulse should be fired.

By choosing appropriate circuit components, it has been found that it is possible to fire in excess of 1 million pulses per second.

Thus it will be seen that current amplifying means 300 will normally be powered by the lower voltage $V_{DC2}$ (for low power dissipation) so long as that lower voltage $V_{DC2}$ is sufficient to keep current amplifying means 300 out of saturation. On the other hand, pulses of very short duration and fixed, higher voltage amplitude $V_{DC1}$ will be applied to current amplifying means 300 whenever, and as long as, the difference between the instantaneous voltage amplitude of the output signal from current amplifying means 300 (or voltage amplifying means 200) and the voltage of the input powering current amplifying means 300 rises above the aforementioned predetermined value, i.e., whenever current amplifying means 300 approach saturation while being powered at the lower voltage $V_{DC2}$. In other words, pulse generating means 400 will generate power pulses whenever, and so long as, the difference between the instantaneous voltage amplitude of the second relatively high voltage signal and $V_{CC}$ drops to the point at which current amplifying means 300 approach saturation. In this way the instantaneous current requirements demanded by load 1000 are met, yet on an extremely efficient basis.

Significantly, the density of high voltage pulses issued to current amplifying means 300 by pulse generating means 400 is directly proportional to the instantaneous voltage amplitude of the signal being applied to current amplifying means 300 and hence in accordance with the power consumed by the load.

Figure 2:
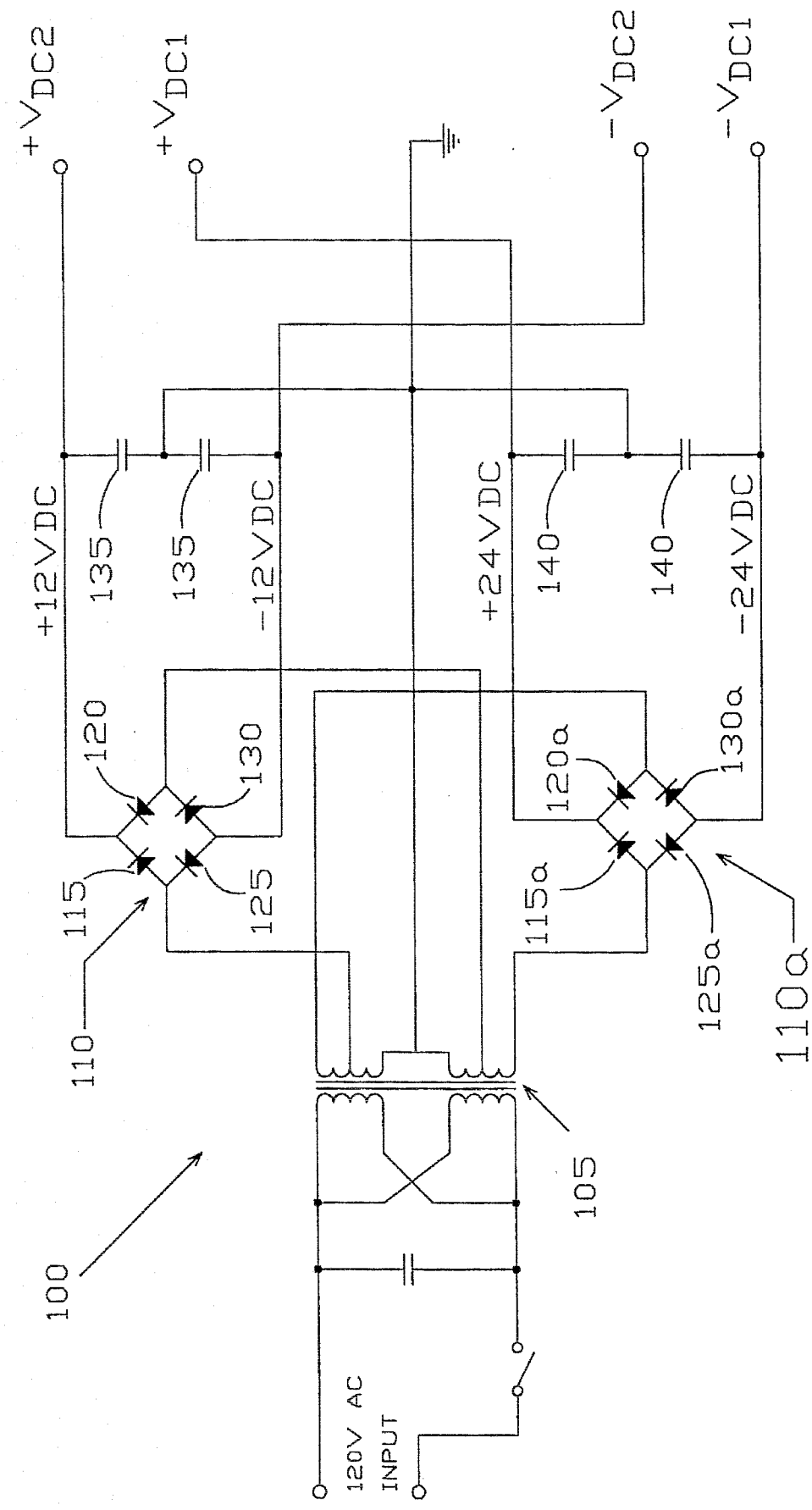
FIG. 2 is a schematic diagram illustrating one form of power supply which may be used with the present invention.
Figure 3:
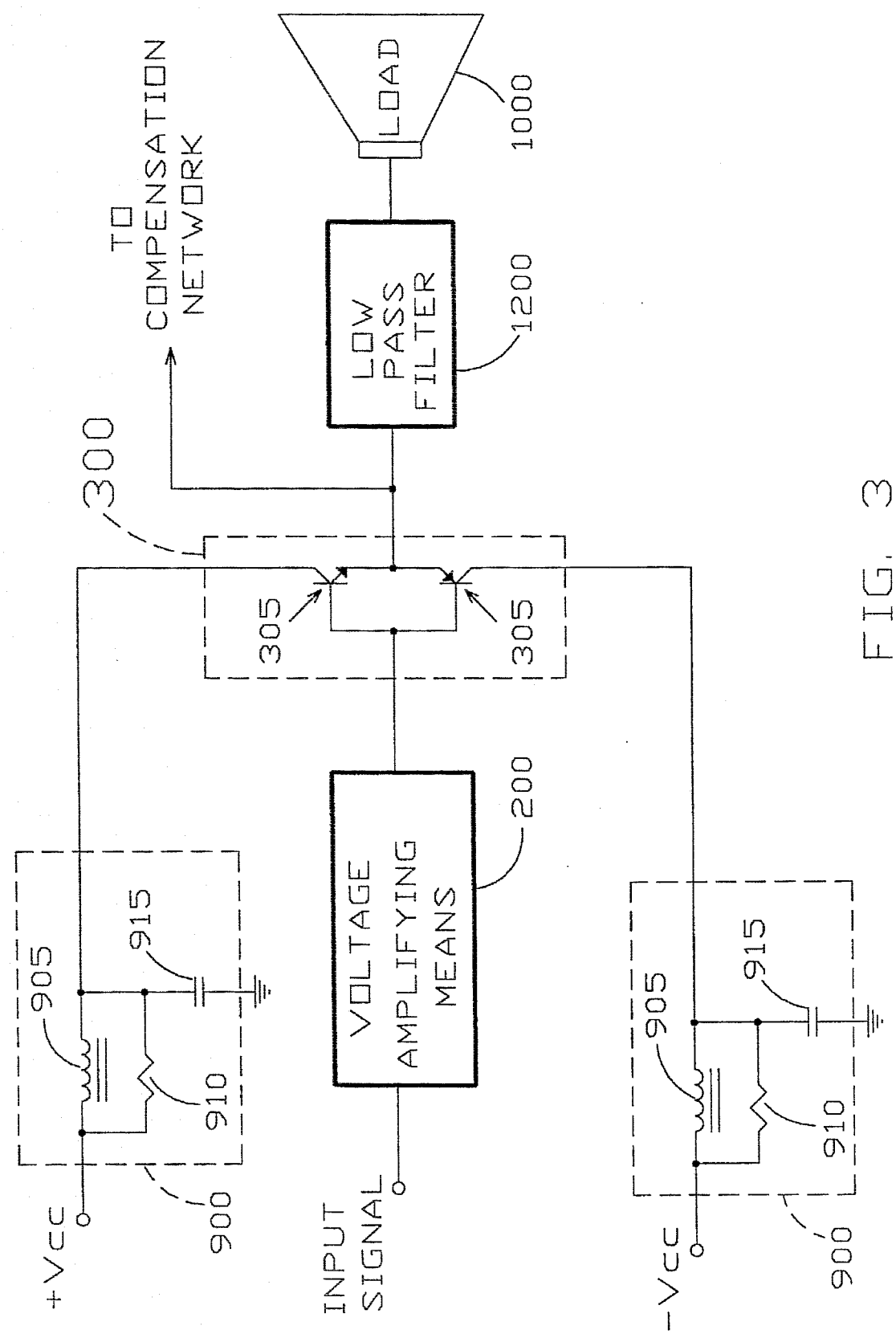
FIG. 3 is a schematic diagram illustrating the voltage amplifying means, the current amplifying means and the pulse filters of the present invention, as connected through a low pass filter to a load.
Figure 4:
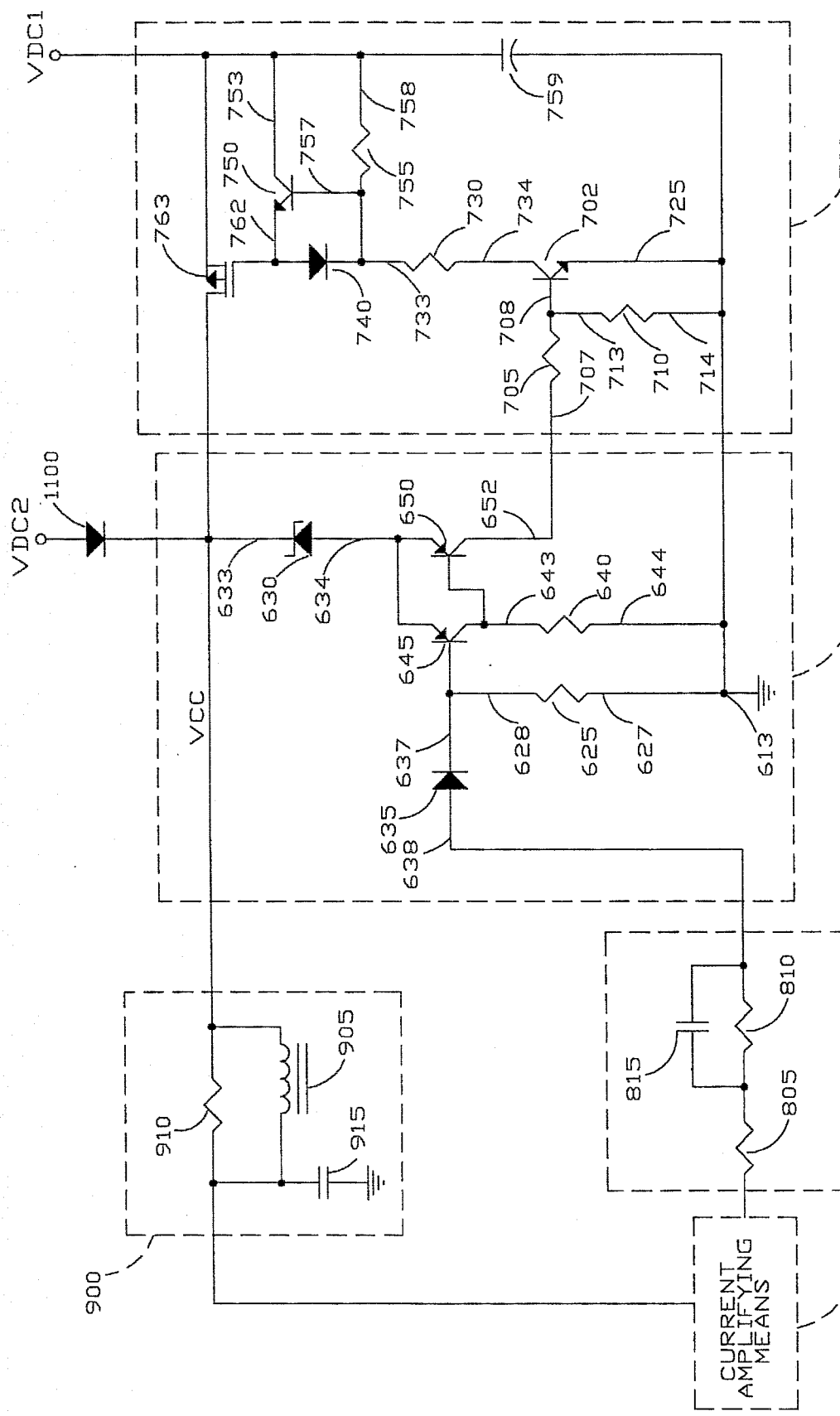
FIG. 4 is a schematic diagram illustrating the current amplifying means, the high speed switch, the power switch, the compensation network and the pulse filter of the preferred embodiment of the present invention.

Further details of the preferred embodiment of the linear power amplifier with pulse density modulated switching power supply are shown in FIGS. 2–4.

Looking next at FIGS. 1 and 2, power supply means 100 preferably comprise a transformer 105 adapted for AC to DC conversion. Transformer 105 is typically a 50/60 hz power transformer having dual center tap windings of the sort well known in the art. Power supply means 100 provides $V_{DC1}$ (e.g., 24 volts DC) and $V_{DC2}$ (e.g., 12 volts DC) from a power main or other source of AC voltage. It will be understood that other relative voltage values may also be used without departing from the scope of the present invention.

A pair of full wave bridge rectifiers 110 and 110a receive the output of transformer 105. Full wave bridge rectifiers 110 and 110a comprise diodes 115, 120, 125 and 130, and 115a, 120a, 125a and 130a, respectively, as seen in FIG. 2. Capacitors 135 and 140 provide filtering for $V_{DC2}$ and $V_{DC1}$, respectively. Thus, power supply means 100 provides four output voltages, at (+) and (−) $V_{DC1}$ and (+) and (−) $V_{DC2}$.

Turning now to FIGS. 1 and 3, voltage amplifying means 200 preferably comprise a sensitive, high gain voltage amplifier of the sort well known in the art. Voltage amplifying means 200 amplify the voltage component of a low level, audio-frequency signal received from a typical audio signal source, e.g. a microphone amplifier, a CD player, a computer sound card, etc. Voltage amplifying means 200 are powered by high level voltage, i.e., $V_{DC1}$. Typically, voltage amplifying means 200 may comprise an LM391 voltage amplifier manufactured by National Semiconductor Corporation or a similar voltage amplifier of the sort well known in the art.

Looking next at FIGS. 1, 3 and 4, current amplifying means 300 are driven by voltage amplifying means 200 and provide current gain to the signal powering load 1000. In particular, it should be noted that current amplifying means 300 provide unity voltage gain to the signal powering load 1000. Current amplifying means 300 are powered by the voltage $V_{CC}$. $V_{CC}$ is normally set at $V_{DC2}$, except for when pulse generating means 400 are supplying a power pulse to current amplifying means 300, in which case $V_{CC}$ is at $V_{DC1}$, as will hereinafter be described in further detail. Current amplifying means 300 may comprise, for example, two current gain transistors 305, e.g. either two MJ15024 or two MJ15025 transistors manufactured by the Motorola Corporation or similar transistors of the sort well known in the art.

Voltage amplifying means 200 and current amplifying means 300 together provide the required voltage swing and high current needed to properly power load 1000.

Looking next at FIGS. 1 and 4, pulse generating means 400 generally comprise high speed switch 600, power switch 700, compensation network 800 and pulse filter 900.

High speed switch 600 comprises a zener diode 630, a diode 635, two resistors 625 and 640, and two transistors 645 and 650. High speed switch 600 is connected as follows. Resistor 625 includes leads 627 and 628. Lead 627 is electrically connected to circuit ground potential 6 13, and lead 628 is electrically connected to the base of transistor 645. Zener diode 630 comprises leads 633 and 634. Lead 633 is electrically connected to $V_{CC}$, and lead 634 is connected to the emitters of transistors 645 and 650. Resistor 640 comprises leads 643 and 644. Lead 643 is connected to the collector of transistor 645 and to the base of transistor 650. Lead 644 is connected to circuit ground potential 613. Additionally, the base of transistor 645 is also connected to lead 637 of diode 635. Diode 635 is also connected to compensation network 800 via lead 638.

Compensation network 800 comprises two resistors 805 and 810, and a capacitor 815. These elements are arranged so as to place capacitor 815 in parallel electrical relationship with resistor 810. One end of the parallel circuit of capacitor 815 and resistor 810 is connected to resistor 805; the other end of the parallel circuit of capacitor 815 and resistor 810 is connected to lead 638 of diode 635. Resistor 805 is also connected to the output of current amplifying means 300. In the preferred embodiment, the values of capacitor 815 and resistors 805 and 810 are chosen so as to be compatible with an audio-frequency bandwidth of between about 20 hz to about 20 Khz. Of course, other applications of the present invention could dictate other values for these components.

Still referring to FIGS. 1 and 4, power switch 700 comprises a transistor 702 and a resistor 705. Collector output lead 652 of transistor 650 is electrically connected to the base of transistor 702 via resistor 705. More particularly, resistor 705 includes leads 707 and 708. A resistor 710 comprises leads 713 and 714. Collector lead 652 of transistor 650 is electrically connected to lead 707 of resistor 705. Lead 708 of resistor 705 is electrically connected to lead 713 of resistor 710 and to the base of transistor 702. Lead 714 of resistor 710 is electrically connected to circuit ground potential 613.

The emitter of transistor 702, indicated at 725, is electrically connected to circuit ground potential 613. A resistor 730 comprises leads 733 and 734. Lead 734 of resistor 730 is electrically connected to the collector of transistor 702. Lead 733 of resistor 730 is connected to the cathode of a diode 740. Lead 733 of resistor 730 and the cathode of diode 740 are also electrically connected to the base of a transistor 750.

A resistor 755 comprises two leads 757 and 758. Lead 757 is connected to the base of transistor 750, and to lead 733 of resistor 730, and to the cathode of diode 740. Lead 758 of resistor 755 is connected to $V_{DC1}$ at a point between $V_{DC1}$ and a capacitor 759. Capacitor 759 is placed between lead 758, $V_{DC1}$ and circuit ground potential 613. Collector lead 753 of transistor 750 is electrically connected to $V_{DC1}$. The emitter lead 762 of transistor 750 is electrically connected to the anode of diode 740 and to the gate of power MOSFET 763. Power MOSFET 763 has its source electrically connected to $V_{DC1}$ and its drain electrically connected to the $V_{CC}$ line.

The foregoing circuit operates as follows. Resistors 625 and 640 regulate the current flowing through high speed switch 600. Zener diode 630 sets the operating voltage for the emitters of transistors 645 and 650, depending on the level of $V_{CC}$. In particular, zener diode 630 is selected so that (i) transistor 645 is in saturation, or "on", and transistor 650 is not in saturation, or "off", when the amplitude of the second, relatively high voltage signal is sufficiently far below the level of the voltage of the input powering current amplifying means 300 so as not to cause the current amplifying means to approach saturation, and (ii) transistor 645 is not in saturation, or "off", and transistor 650 is in saturation, or "on", when the amplitude of the second, relatively high voltage signal rises high enough relative to the level of the voltage of the input powering current amplifying means 300 so as to cause the current amplifying means to approach saturation. In other words, the breakdown voltage $V_z$ of zener diode 630 is chosen so that when the voltage at the base of transistor 645 is less than the value ($V_{CC}-V_Z-V_{BE}$), where $V_{BE}$ is the base-to-emitter forward voltage of transistor 645, transistor 645 will be "on", since this condition corresponds to the situation where current amplifying means 300 are not approaching saturation. At the same time, the breakdown voltage $V_Z$ of zener diode 630 is chosen so that when the voltage at the base of transistor 645 is greater than the value ($V_{CC}-V_Z-V_{BE}$), transistor 645 will be "off", since this condition corresponds to the situation where current amplifying means 300 are approaching saturation and a power pulse is to be fired by pulse generating means 400.

As a result of this construction, transistor 645 will be "on" and transistor 650 will be "off" as long as the output voltage of current amplifying means 300 (or voltage amplifying means 200) remains sufficiently far below the voltage of the input powering current amplifying means 300 so as not to cause the current amplifying means to approach saturation. Accordingly, transistor 702 will also be "off", transistor 750 will be "on", and power MOSFET 763 will be "off".

However, when the amplitude of the second, relatively high voltage signal rises high enough relative to the voltage of the input powering current amplifying means 300 to cause the current amplifying means to approach saturation, transistor 645 will be switched "off", transistor 650 will be switched "on", and transistor 702 will be switched "on". When transistor 702 turns "on", diode 740 is biased into conduction, and transistor 750 is turned "off". When diode 740 is in conduction, the gate voltage of power MOSFET 763 falls, giving a forward bias to turn "on" power MOSFET 763. When power MOSFET 763 turns "on", $V_{CC}$ rises very quickly to $V_{DC1}$, thereby supplying current amplifying means 300 with the higher voltage needed to prevent signal clipping.

As soon as $V_{CC}$ rises to $V_{DC1}$, however, the voltage present at the cathode of zener diode 630 will once again be high enough relative to the amplitude of the second, relatively high voltage signal present at the base of transistor 645 to turn transistor 645 back "on" and transistor 650 back "off". This change in state of high speed switch 600 in turn causes transistor 702 to switch "off" and, therefore, transistor 750 to switch "on". This causes power MOSFET 763 to return to its "off" state, thereby permitting $V_{CC}$ to return toward $V_{DC2}$. In effect, at the very moment the circuit boosts $V_{CC}$ so as to keep current amplifying means 300 out of saturation, the circuit starts to turn itself off again to terminate the power pulse.

Thus, with each cycle of high speed switch 600 and power switch 700, a power pulse of approximately 1 microsecond duration, and having a peak amplitude corresponding to $V_{DC1}$, is created. The frequency of the generated pulses is directly related to (i) the amplitude of the second, relatively high voltage signal provided by current amplifying means 300 (or voltage amplifying means 200 as indicated at 1301 in FIGS. 5 and 6), and (ii) the voltage of the input powering the current amplifying means. In particular, each time the instantaneous voltage amplitude of the second, relatively high voltage signal rises to a level that will cause current gain transistors 305 to approach their saturation point, the pulse circuit 400 fires and $V_{CC}$ is very quickly raised to the $V_{DC1}$ voltage level. However, as soon as $V_{CC}$ reaches $V_{DC1}$, a large voltage drop occurs across resistor 625, immediately returning transistor 645 to its first "on" state, whereby $V_{CC}$ will return toward $V_{DC2}$. Thus, a 1 microsecond wide pulse of amplitude $V_{DC1}$ is created.

Figure 5:
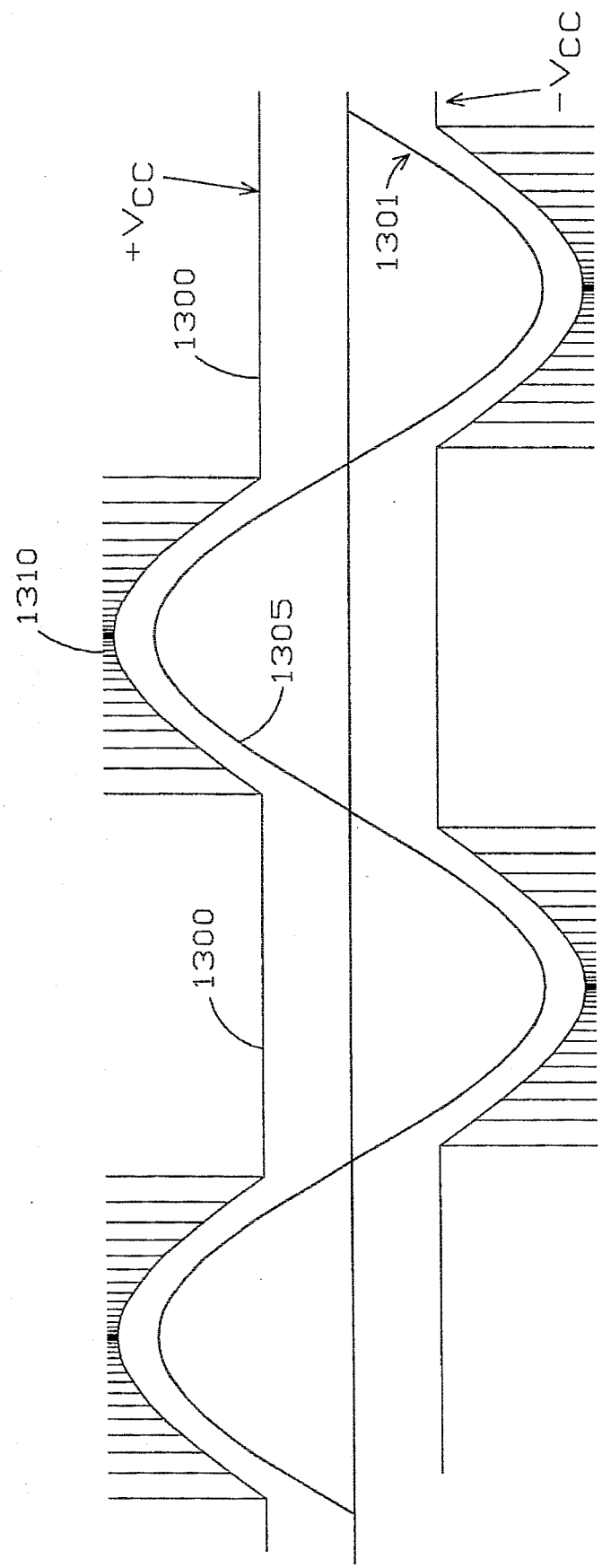
FIG. 5 is a graph illustrating (i) the second, relatively high voltage signal generated by the voltage amplifying means, and (ii) the output of the pulse density modulated switching power supply, with the output of the pulse density modulated switching power supply being shown before passage through the pulse filters.
Figure 6:
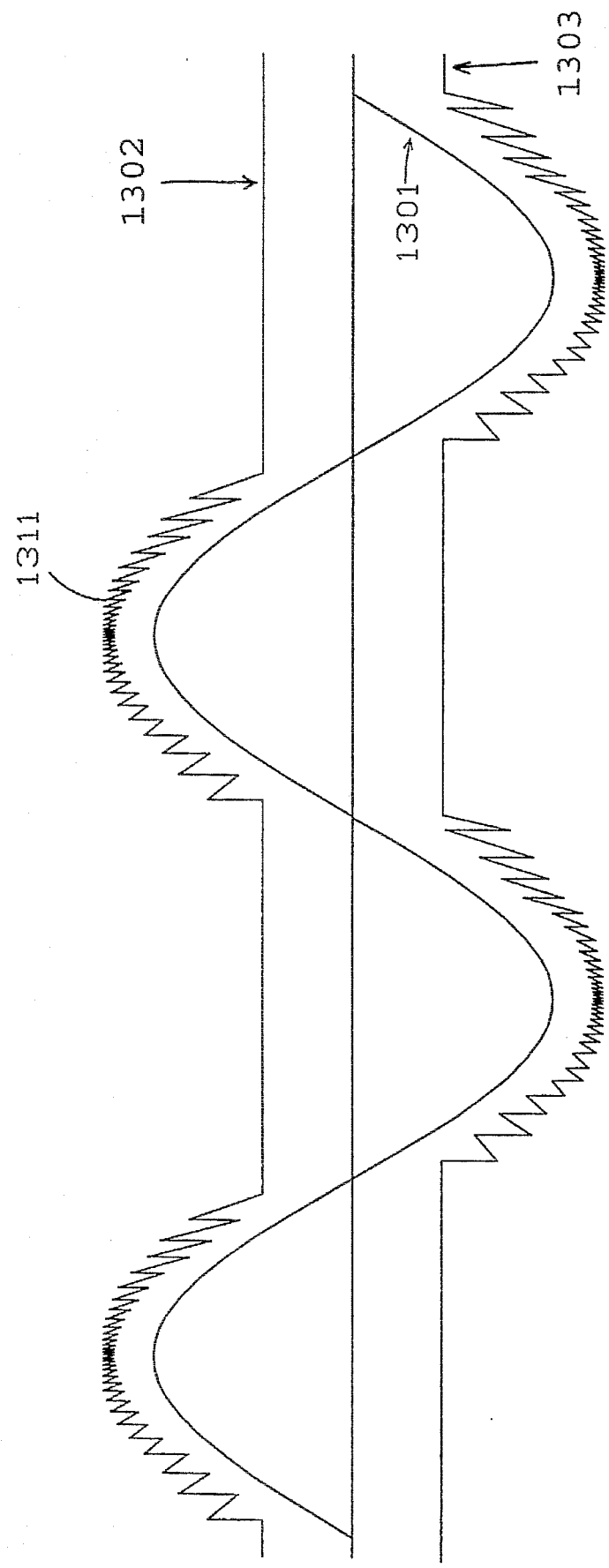
FIG. 6 is a graph illustrating (i) the second, relatively high voltage signal generated by the voltage amplifying means, and (ii) the output of the pulse density modulated switching power supply, with the output of the pulse density modulated switching power supply being shown after passage through the pulse filters.

Referring now to FIGS. 5 and 6, the output voltage $V_{CC}$ of pulse generating means 400 is shown. More particularly, so long as the amplitude of the second, relatively high voltage signal remains sufficiently far below the voltage of the input powering current amplifying means 300 (i.e., $V_{CC}$) to keep the current amplifying means out of saturation, no pulse will be fired by pulse generating means 400 and $V_{CC}$ will remain equal to $V_{DC2}$ (as indicated generally at 1300 in FIG. 5). However, when the amplitude of the second, relatively high voltage signal rises high enough relative to the voltage of the input powering current amplifying means 300 to cause the current amplifying means to approach saturation (as indicated generally at 1305), at least one pulse of amplitude $V_{DC1}$ and duration 1 microsecond is fired by pulse generating means 400. This pulse has the effect of keeping current gain transistors 305 out of saturation and thus providing the higher current level required at that signal voltage amplitude to properly drive the load. In this respect it is to be appreciated that at higher signal amplitude voltages, a greater density of pulses will be released by pulse generating means 400 (as indicated generally at 1310 in FIG. 5). As the signal voltage drops off, the density of pulses will similarly decrease.

Looking again at FIG. 3, pulse filters 900 comprise an inductor 905, a resistor 910 and a capacitor 915. Pulse filters 900 have an appropriately-selected time constant for adjusting the pulse profile received at the collectors of current gain transistors 305. More particularly, because the density of pulses is signal dependent, these pulses—after being filtered by pulse filters 900—will be shaped into a signal-approximated power waveform (as shown generally at 1311 in FIG. 6) for lowering the signal distortion at the amplifier output. In FIG. 6, $+v_{CC}$ (after passing through pulse filter 900) is indicated at 1302, and $-V_{CC}$ (after passing through pulse filter 900) is indicated at 1303.

Figure 7:
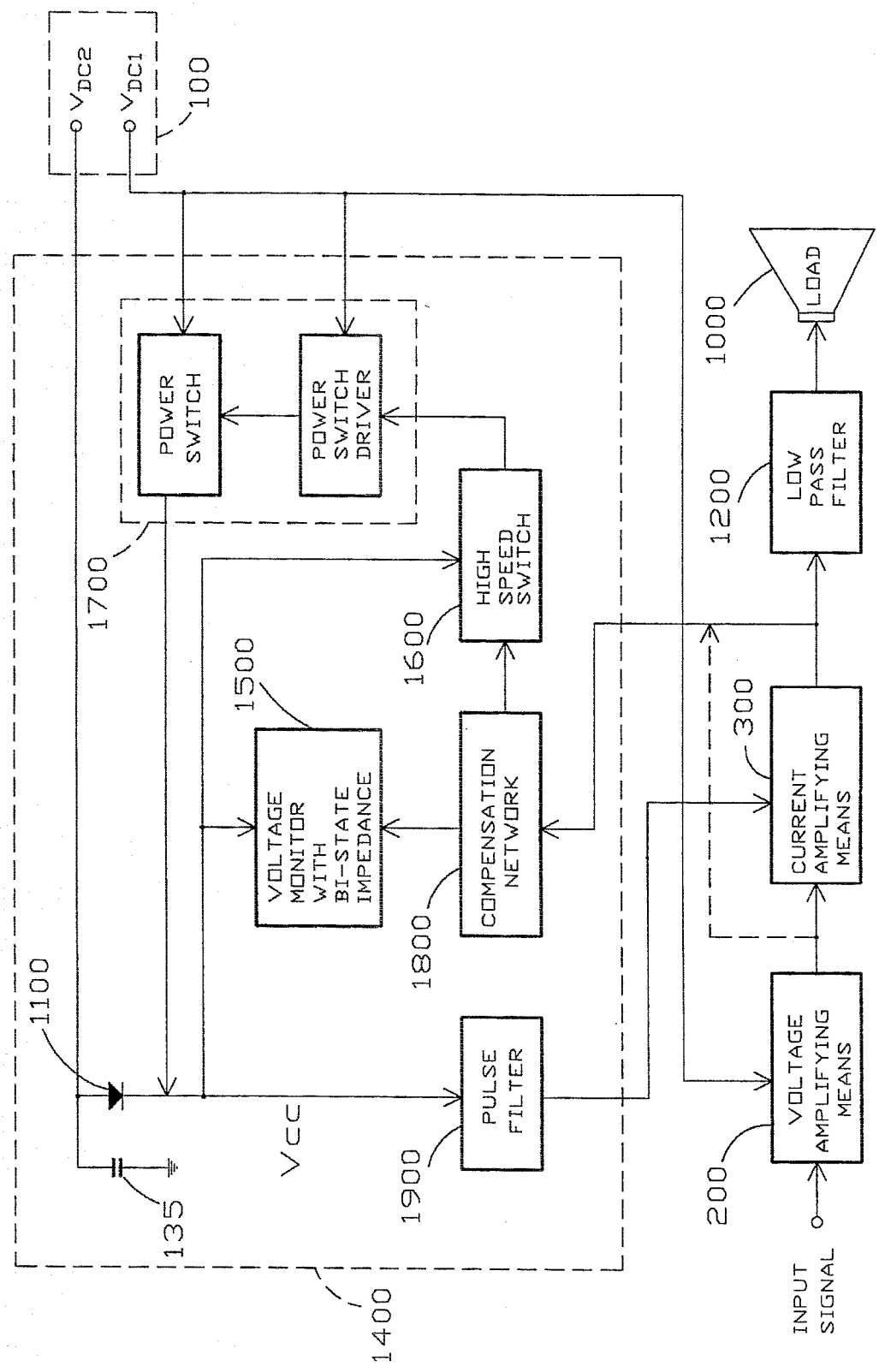
FIG. 7 is a block diagram of an alternative embodiment of a linear power amplifier with pulse density modulated switching power supply formed in accordance with the present invention.
Figure 8:
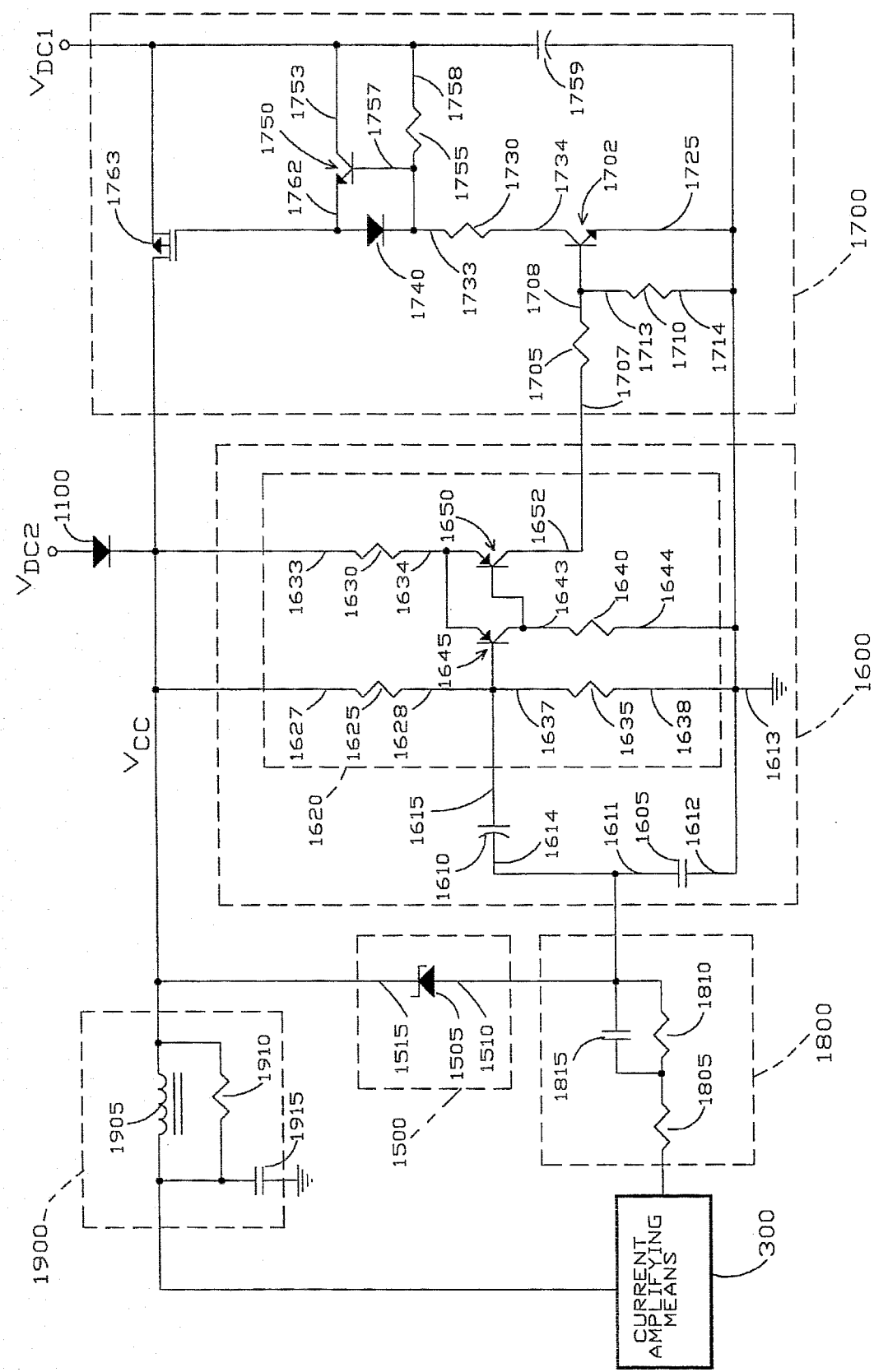
FIG. 8 is a schematic diagram illustrating the current amplifying means, the voltage monitor with bi-state impedance, the high speed switch, the power switch, the compensation network and the pulse filter of the alternative embodiment of the present invention.

Looking next at FIGS. 7 and 8, an alternative embodiment of the present invention generally comprises power supply means 100, voltage amplifying means 200, current amplifying means 300 and pulse generating means 1400. Power supply means 100, voltage amplifying means 200 and current amplifying means 300 are identical to power supply means 100, voltage amplifying means 200 and current amplifying means 300 previously disclosed in detail above in connection with the preferred embodiment of the present invention, i.e., the embodiment depicted in FIGS. 1–6.

Pulse generating means 1400 generally comprise a voltage monitor with bi-state impedance 1500, a high speed switch 1600, a power switch 1700, a compensation network 1800 and a pulse filter 1900. Compensation network 1800 and pulse filter 1900 are identical to compensation network 800 and pulse filter 900 previously disclosed in detail above in connection with the preferred embodiment of the present invention, i.e., the embodiment depicted in FIGS. 1–6.

Still referring to FIG. 7, voltage monitor with bi-state impedance 1500 compares the voltage amplitude of the output signal of current amplifying means 300 (or voltage amplifying means 200) with the level of the voltage powering current amplifying means 300, i.e., $V_{CC}$. Voltage monitor with bi-state impedance 1500 is adapted to be in one of two distinct states. A first state, characterized by very low impedance, occurs when the second, relatively high voltage signal remains sufficiently far below the voltage of the input powering current amplifying means 300 to keep the current amplifying means out of saturation. A second state, characterized by very high impedance, occurs when the second, relatively high voltage signal rises high enough relative to the voltage of the input powering current amplifying means 300 to cause the current amplifying means to approach saturation. In this respect it will be understood that the particular choice of components making up the linear power amplifier with pulse density modulated switching power supply will determine an exact point at which the voltage monitor with bi-state impedance 1500 will change state.

High speed switch 1600 is also adapted to be in one of two states. More particularly, high speed switch 1600 comprises a first state corresponding to a switch "off" position which is maintained while voltage monitor with bi-state impedance 1500 is in its first, very low impedance state. High speed switch 1600 further comprises a second state corresponding to a switch "on" position that is induced when voltage monitor with bi-state impedance 1500 changes from its first, low impedance state to its second, high impedance state.

Power switch 1700 is also capable of being in one of two states. More particularly, power switch 1700 comprises a first state corresponding to a switch "off" position which is maintained while high speed switch 1600 is in its first "off" state. When power switch 1700 is in its first "off" state, $V_{DC1}$ is obstructed and $V_{CC}$ is powered by $V_{DC2}$. Power switch 1700 also comprises a second state corresponding to a switch "on" position which is induced when high speed switch 1600 is in its second, "on" position. When power switch 1700 is in its second, "on" state, $V_{DC1}$ is not obstructed and $V_{CC}$ will rise rapidly to $V_{DC1}$. As this happens, high speed diode 1100 (FIGS. 7 and 8) receives a reverse bias, thus effectively blocking $V_{DC2}$.

Compensation network 1800 is disposed between (i) voltage amplifying means 200, and (ii) voltage monitor with bi-state impedance 1500 and high speed switch 1600. Preferably compensation network 1800 is disposed between (i) current amplifying means 300 and (ii) voltage monitor with bi-state impedance 1500 and high speed switch 1600. Compensation network 1800 comprises appropriately chosen resistor and capacitor components so as to provide bias to voltage monitor with bi-state impedance 1500 and so as to set the operating point of high speed switch 1600. Furthermore, compensation network 1800 corrects for unwanted phase shifts of pulse generating means 1400.

Pulse filter 1900 is used to condition the waveform of the high voltage pulse provided by pulse generating means 1400 prior to the application of that pulse to current amplifying means 300.

Referring still to FIG. 7, the foregoing alternative embodiment of the present invention (i.e., the embodiment of FIGS. 7 and 8) operates as follows. A first, relatively low voltage signal is received by voltage amplifying means 200. Voltage amplifying means 200 amplify this first, relatively low voltage signal into a second, relatively high voltage signal. Voltage amplifying means 200 are powered by $V_{DC1}$, and provide all of the voltage gain applied to the low level signal prior to driving load 1000. The output of voltage amplifying means 200 is applied to current amplifying means 300 so as to power load 1000, via low pass filter 1200.

As this is occurring, pulse generating means 1400 continuously compare the instantaneous voltage amplitude of the output signal of current amplifying means 300 (or voltage amplifying means 200) with the level of the voltage powering current amplifying means 300. More particularly, the instantaneous voltage amplitude of the output signal of current amplifying means 300 (or voltage amplifying means 200) is continuously compared with the level of the voltage powering current amplifying means 300 (i.e., $V_{CC}$) via voltage monitor with bi-state impedance 1500. So long as the difference between the two is greater than or equal to some predetermined value, i.e., a value sufficient to ensure that current amplifying means 300 are not approaching saturation, voltage monitor with bi-state impedance 1500 will remain in its first, very low impedance state. As a result, high speed switch 1600 will remain in its first "off" state, and power switch 1700 will remain in its first "off" state. Accordingly, $V_{CC}$ will remain at $V_{DC2}$. Thus, current amplifying means 300 will be powered by the lower voltage $V_{DC2}$ as long as this lower voltage level is sufficient to keep current amplifying means 300 out of saturation.

If, however, the instantaneous voltage amplitude of the output signal of current amplifying means 300 (or low voltage amplifying means 200) rises high enough relative to the voltage of the input powering current amplifying means 300 to cause the current amplifying means to approach saturation, voltage monitor with bi-state impedance 1500 will change states. In particular, voltage monitor with bi-state impedance 1500 will switch from its first, very low impedance state to its second, very high impedance state. This change in state in turn induces a change in state in high speed switch 1600, from its first "off" state to its second "on" state. Once high speed switch 1600 changes state, from "off" to "on", power switch 1700 also changes state, from "off" to "on". This causes $V_{CC}$ to instantaneously rise from its normal $V_{DC2}$ level to the higher voltage level $V_{DC1}$. As a result, current amplifying means 300 will be powered by the higher voltage $V_{DC1}$, so as to keep current amplifying means 300 out of saturation.

As soon as $V_{CC}$ rises to $V_{DC1}$, however, the voltage difference across voltage monitor with bi-state impedance 1500 will once again exceed the aforementioned predetermined value tested for by voltage monitor with bi-state impedance 1500. As a result, voltage monitor with bi-state impedance 1500 will immediately switch back from its second, very high impedance state to its first, very low impedance state. High speed switch 1600 thereupon immediately switches from its second "on" state to its first "off" state, thereby causing power switch 1700 to also immediately switch from its second "on" state to its first "off" state. Thus $V_{CC}$ settles back toward $V_{DC2}$. In essence then, as soon as the circuit turns itself on so as to raise $V_{CC}$ to $V_{DC1}$, the circuit also starts to turn itself off so as to restore $V_{CC}$ toward $V_{DC2}$. Thus a power pulse of very short duration and fixed amplitude $V_{DC1}$ is created whenever the voltage amplitude of the second, relatively high voltage signal rises high enough vis-a-vis the level of the voltage powering the current amplifying means to cause the current amplifying means to approach saturation.

The system then immediately and continuously repeats the foregoing process over and over again to determine if and when another power pulse should be fired.

By choosing appropriate circuit components, it has been found that it is possible to fire in excess of 1 million pulses per second.

Thus it will be seen that current amplifying means 300 will normally be powered by the lower voltage $V_{DC2}$ so long as this lower voltage $V_{DC2}$ is sufficient to keep current amplifying means 300 out of saturation. On the other hand, pulses of very short duration and fixed amplitude $V_{DC1}$ will be applied to current amplifying means 300 whenever, and as long as, the difference between the instantaneous voltage amplitude of the output signal from current amplifying means 300 (or voltage amplifying means 200) and the voltage of the input powering current amplifying means 300 rises above the aforementioned predetermined value, i.e., whenever current amplifying means 300 approach saturation while being powered at the lower voltage $V_{DC2}$. In other words, pulse generating means 1400 will generate power pulses whenever, and so long as, the difference between the instantaneous voltage amplitude of the second, relatively high voltage signal and $V_{CC}$ drops to the point at which current amplifying means 300 approach saturation. In this way the instantaneous current requirements demanded by load 1000 are met, yet on an extremely efficient basis.

Significantly, the density of high voltage pulses issued to current amplifying means 300 by pulse generating means 1400 is directly proportional to the instantaneous voltage amplitude of the signal being applied to current amplifying means 300 and hence in accordance with the power consumed by the load.

Further details of the alternative embodiment of the linear power amplifier with pulse density modulated switching power supply are shown in FIGS. 7 and 8.

More particularly, pulse generating means 1400 generally comprise voltage monitor with bi-state impedance 1500, high speed switch 1600, power switch 1700, compensation network 1800 and pulse filter 1900.

Voltage monitor with bi-state impedance 1500 may comprise a zener diode 1505 having an anode 1510 and a cathode 15 15. Cathode 15 15 is electrically connected to $V_{CC}$. Anode 1510 of zener diode 1505 is electrically connected to both high speed switch 1600 and compensation network 1800, as will hereinafter be disclosed in further detail.

Compensation network 1800 comprises two resistors 1805 and 1810, and a capacitor 1815. These elements are arranged so as to place capacitor 1815 in parallel electrical relationship with resistor 1810. One end of the parallel circuit of capacitor 1815 and resistor 1810 is connected to resistor 1805; the other end of the parallel circuit of capacitor 1815 and resistor 1810 is connected to anode 1510 of zener diode 1505. Resistor 1805 is also connected to the output of current amplifying means 300. As in the preferred embodiment of FIGS. 1–6, the values of capacitor 1815 and resistors 1805 and 1810 in compensation network 1800 are preferably chosen so as to be compatible with an audio frequency bandwidth of between about 20 hz to about 20 Khz. Of course, other applications of the present invention could dictate other values for these components.

Anode 1510 of zener diode 1505 is further electrically connected to capacitors 1605 and 1610 of high speed switch 1600. Capacitor 1605 comprises leads 1611 and 1612. Capacitor 1605 is electrically connected to anode 1510 of zener diode 1505 via lead 1611, and to circuit ground potential 1613 via lead 1612. Capacitor 1610 comprises leads 1614 and 1615. Capacitor 1610 is electrically connected between anode 15 10 of zener diode 1505 and the input of a Schmitt trigger 1620. More particularly, capacitor 1610 is electrically connected to anode 1510 of zener diode 1505 via lead 1614, and to the input of Schmitt trigger 1620 via lead 1615.

Schmitt trigger 1620 comprises resistors 1625, 1630, 1635 and 1640, and two transistors 1645 and 1650. Schmitt trigger 1620 is connected as follows. Resistor 1625 includes leads 1627 and 1628. Lead 1627 is electrically connected to $V_{CC}$ and lead 1628 is electrically connected to the base of transistor 1645. Resistor 1630 comprises leads 1633 and 1634. Lead 1633 is electrically connected to $V_{CC}$ and lead 1634 is connected to the emitters of transistors 1645 and 1650. Resistor 1635 comprises leads 1637 and 1638. Lead 1637 is electrically connected to the base of transistor 1645 and lead 1638 is connected to circuit ground potential 1613. Resistor 1640 comprises leads 1643 and 1644. Lead 1643 is connected to the collector of transistor 1645 and to the base of transistor 1650. Lead 1644 is connected to circuit ground potential 1613. Additionally, the base of transistor 1645 is connected to lead 1615 of capacitor 1610.

Collector output lead 1652 of transistor 1650 is electrically connected to the base of a transistor 1702 of power switch 1700 via a resistor 1705. More particularly, resistor 1705 includes leads 1707 and 1708. A resistor 1710 comprises leads 1713 and 1714. Collector lead 1652 of transistor 1650 is electrically connected to lead 1707 of resistor 1705. Lead 1708 of resistor 1705 is electrically connected to lead 1713 of resistor 1710, and to the base of transistor 1702. Lead 1714 of resistor 1710 is electrically connected to circuit ground potential 1613.

The emitter of transistor 1702, indicated at 1725, is electrically connected to circuit ground potential 1613. A resistor 1730 comprises leads 1733 and 1734. Lead 1734 is electrically connected to the collector of transistor 1702, and lead 1733 of resistor 1730 is connected to the cathode of a diode 1740. Lead 1733 of resistor 1730 and the cathode of diode 1740 are also electrically connected to the base of a transistor 1750.

A resistor 1755 comprises two leads 1757 and 1758. Lead 1757 is connected to the base of transistor 1750, and to lead 1733 of resistor 1730, and to the cathode of diode 1740. Lead 1758 of resistor 1755 is connected to $V_{DC1}$ at a point between $V_{DC1}$ and a capacitor 1759. Capacitor 1759 is placed between lead 1758, $V_{DC1}$ and circuit ground potential 1613. Collector lead 1753 of transistor 1750 is electrically connected to $V_{DC1}$. The emitter lead 1762 of transistor 1750 is electrically connected to the anode of diode 1740 and to the gate of power MOSFET 1763. Power MOSFET 1763 has its source electrically connected to $V_{DC1}$ and its drain electrically connected to the $V_{CC}$ line.

Pulse generating means 1400 operate as follows.

Turning first to voltage monitor with bi-state impedance 1500, this circuit element comprises zener diode 1505 which has its anode 1510 electrically connected to the output of current amplifying means 300 (or voltage amplifying means 200) via compensation network 1800, and to the input of high speed switch 1600 via lead 1614 of capacitor 1610 (FIG. 8). The cathode 1515 of zener diode 1505 is electrically connected to $V_{CC}$ at the output of power switch 1700.

Zener diode 1505 has a very low impedance when the voltage potential difference applied across its leads is above its breakdown voltage value (hereinafter referred to as $V_z$). Zener diode 1505 has a very high impedance when the voltage potential difference applied across its leads is below that same breakdown voltage value $V_z$. Zener diode 1505 is chosen so that it will have a breakdown voltage $V_z$ such that (i) the Zener diode will have very low impedance (i.e., it will behave like a "closed" switch) when the second, relatively high voltage signal remains sufficiently far below the level of the voltage of the input powering current amplifying means 300 to keep the current amplifying means out of saturation, and (ii) the Zener diode will have very high impedance (i.e., it will act like an "open" switch) when the second, relatively high voltage signal rises high enough relative to the level of the voltage of the input powering current amplifying means 300 to cause the current amplifying means to approach saturation.

For the circuit shown in FIGS. 7 and 8, a preferred value of the breakdown voltage for zener diode 1505 is approximately 4.7 volts. It will be understood by those skilled in the art, however, that this choice of breakdown voltage may vary according to the parametric requirements of the various other components in the circuit.

Turning next to high speed switch 1600, transistors 1645 and 1650, in combination with resistors 1625, 1630, 1635 and 1640, form a conventional Schmitt trigger circuit. The bias point at the base of transistor 1645 is set by resistor 1625 (located between $V_{CC}$ and the base of transistor 1645 in FIG. 8), and by resistor 1635 (located between the base of transistor 1645 and circuit ground potential 1613). The bias point at the base of transistor 1650 is set by resistors 1630 and 1640. Capacitor 1610 does not set the bias point of transistors 1645 and 1650; instead, it is used to block the DC content of the output of voltage monitor with bi-state impedance 1500 so as not to affect the operating point of Schmitt trigger 1620. In pulse generating means 1400, transistor 1645 is in saturation (i.e., "on") when the output voltage of current amplifying means 300 (or voltage amplifying means 200) is sufficiently far below the level of the voltage of the input powering current amplifying means 300 to keep the current amplifying means out of saturation. Transistor 1645 is not in saturation (i.e., it is "off") when the output voltage of current amplifying means 300 (or voltage amplifying means 200) rises high enough relative to the level of the voltage of the input powering current amplifying means 300 to cause current amplifying means 300 to approach saturation. Furthermore, transistor 1650 is "off" when transistor 1645 is "on", and transistor 1650 is "on" when transistor 1645 is "off".

Capacitor 1605 serves as a speeding capacitor. The value of capacitor 1605 is selected so that it will act like a short circuit to ground in response to a power pulse passing through the $V_{CC}$ line, as will hereinafter be discussed in further detail. The "speeding" effect of capacitor 1605, in response to $V_{CC}$ increasing to $V_{DC1}$, instantaneously forces a large voltage drop across zener diode 1505. This large voltage drop, coupled through capacitor 1610 to the base of transistor 1645, effectively turns transistor 1645 back into saturation (i.e., "on") instantaneously upon the issuance of a power pulse through the $V_{CC}$ line. In effect, at the very moment that the pulse generating means 1400 put out a power pulse to current amplifying means 300 on the $V_{CC}$ line, the circuit starts to turn itself off again. Compensation network 1800 aids in this process by establishing the voltage value at lead 1614 of capacitor 1610.

Turning next to power switch 1700, resistors 1705 and 1710 bias the base of transistor 1702. When transistor 1650 is switched "on" by a change in the bias of the base of transistor 1645, transistor 1702 is also turned "on". The collector of transistor 1702 is coupled to the base of transistor 1750 via resistor 1730. When transistor 1702 turns "on", diode 1740 is biased into conduction, and transistor 1750 is turned "off". When diode 1740 is in conduction, the gate voltage of MOSFET 1763 falls, giving it a forward bias, thus turning it "on" so as to raise $V_{CC}$ to $V_{DC1}$. Subsequently, during reset, transistor 1750 removes the gate storage charge of the power MOSFET 1763 for fast recovery thereof.

As soon as $V_{CC}$ rises to $V_{DC1}$, however, the voltage present at the cathode of zener diode 1505 will once again be high enough relative to the amplitude of the second, relatively high voltage signal present at the anode of zener diode 1505 to return zener diode 1505 to its first, low impedance state. At the same time, the voltage between $V_{CC}$ and the base of transistor 1645 (across resistor 1625) increases, thereby turning transistor 1645 back "on" and turning transistor 1650 back "off". This causes transistor 1702 to turn back "off", transistor 1750 to turn back "on", and MOSFET 1763 to turn back "off". This causes $V_{CC}$ to settle back toward $V_{DC2}$. In effect, at the very moment that pulse generating means 1400 boosts $V_{CC}$ so as to keep current amplifying means 300 out of saturation, the circuit starts to turn itself off.

Thus it will be seen that so long as the voltage output of the current amplifying means 300 remains sufficiently far below the voltage of the input powering current amplifying means 300 to keep the current amplifying means out of saturation, transistor 1645 will be "on", transistor 1650 will be "off", transistor 1702 will be "off", transistor 1750 will be "on", and MOSFET 1763 will be "off". In other words, so long as the amplitude of the second, relatively high voltage signal remains sufficiently far below the voltage of the input powering current amplifying means 300 to keep the current amplifying means out of saturation, no pulse will be fired. However, when the voltage output of current amplifying means 300 rises high enough relative to the level of the voltage powering current amplifying means 300 to cause the current amplifying means to approach saturation, transistor 1645 will turn "off", transistor 1650 will turn "on", transistor 1702 will turn "on", transistor 1750 will turn "off", and MOSFET 1763 will turn "on". In other words, as soon as the amplitude of the second, relatively high voltage signal rises high enough relative to the level of the voltage powering current amplifying means 300 to cause the current amplifying means to approach saturation, $V_{CC}$ will rise to $V_{DC1}$. Of course, as soon as $V_{CC}$ rises to $V_{DC1}$, transistor 1645 will turn "on" again, transistor 1650 will turn "off" again, transistor 1702 will turn "off" again, transistor 1750 will turn "on" again, and MOSFET 1763 will turn "off" again, thus causing $V_{CC}$ to settle back towards $V_{DC2}$ once more.

The foregoing process repeats itself over and over again, to determine if and when another power pulse should be fired.

Thus, with each cycle of zener diode 1505, Schmitt trigger 1620 and power switch 1700, a power pulse of approximately 1 microsecond duration, and having an amplitude corresponding to $V_{DC1}$, is created. The frequency of the generated pulses is directly related to: (i) the amplitude of the second, relatively high voltage signal provided by current amplifying means 300 (or voltage amplifying means 200), and (ii) the voltage of the input powering the current amplifying means. In particular, each time the instantaneous voltage amplitude of the second, relatively high voltage signal rises to a level that will cause current gain transistors 305 to approach their saturation point, pulse circuit 1400 fires and $V_{CC}$ is very quickly raised to the higher $V_{DC1}$ voltage level. However, as soon as $V_{CC}$ reaches $V_{DC1}$, the potential difference across zener diode 1505 simultaneously increases (due in large part to the action of capacitor 1605), causing zener diode 1505 to immediately return to its first, low impedance state, thus changing the state of Schmitt trigger 1620 and turning off power switch 1700, whereby $V_{CC}$ will settle toward $V_{DC2}$. Thus, a 1 microsecond wide pulse of amplitude $V_{DC1}$ is created.

Referring again to FIGS. 5 and 6, the output voltage $V_{CC}$ of pulse generating means 1400 is shown. More particularly, so long as the amplitude of the second, relatively high voltage signal remains sufficiently far below the voltage of the input powering current amplifying means 300 (i.e., $V_{CC}$ to keep the current amplifying means out of saturation, no pulse will be fired by pulse generating circuit 1400 and $V_{CC}$ will remain equal to $V_{DC1}$ (as indicated generally at 1300 in FIG. 5). However, when the amplitude of the second, relatively high voltage signal rises high enough relative to the voltage of the input powering current amplifying means 300 to cause the current amplifying means to approach saturation (as indicated generally at 1305), at least one pulse of amplitude $V_{DC1}$ and duration 1 microsecond is fired by pulse generating means 1400. This pulse has the effect of driving current gain transistors 305 out of saturation and thus providing the higher current level required at that signal voltage amplitude to properly drive the load. In this respect it should be appreciated that at higher signal amplitude voltages, a greater density of pulses will be released by pulse generating means 1400 (as indicated generally at 1310 in FIG. 5). As the signal voltage drops off, the density of pulses will similarly decrease.

Again, FIG. 6 shows how pulse filters 1900 condition each pulse's profile so as to yield a signal-approximated power waveform. More particularly, pulse filters 1900 comprise an inductor 1905, a resistor 1910 and a capacitor 1915. Pulse filters 1900 have an appropriately-selected time constant for adjusting the pulse profile received at the collectors of current gain transistors 305. More particularly, because the density of pulses is signal dependent, these pulses—after being filtered by pulse filters 1900—will be shaped into a signal-approximated power waveform (as shown generally at 1311 in FIG. 6) for lowering the signal distortion at the amplifier output.

Figure 9:
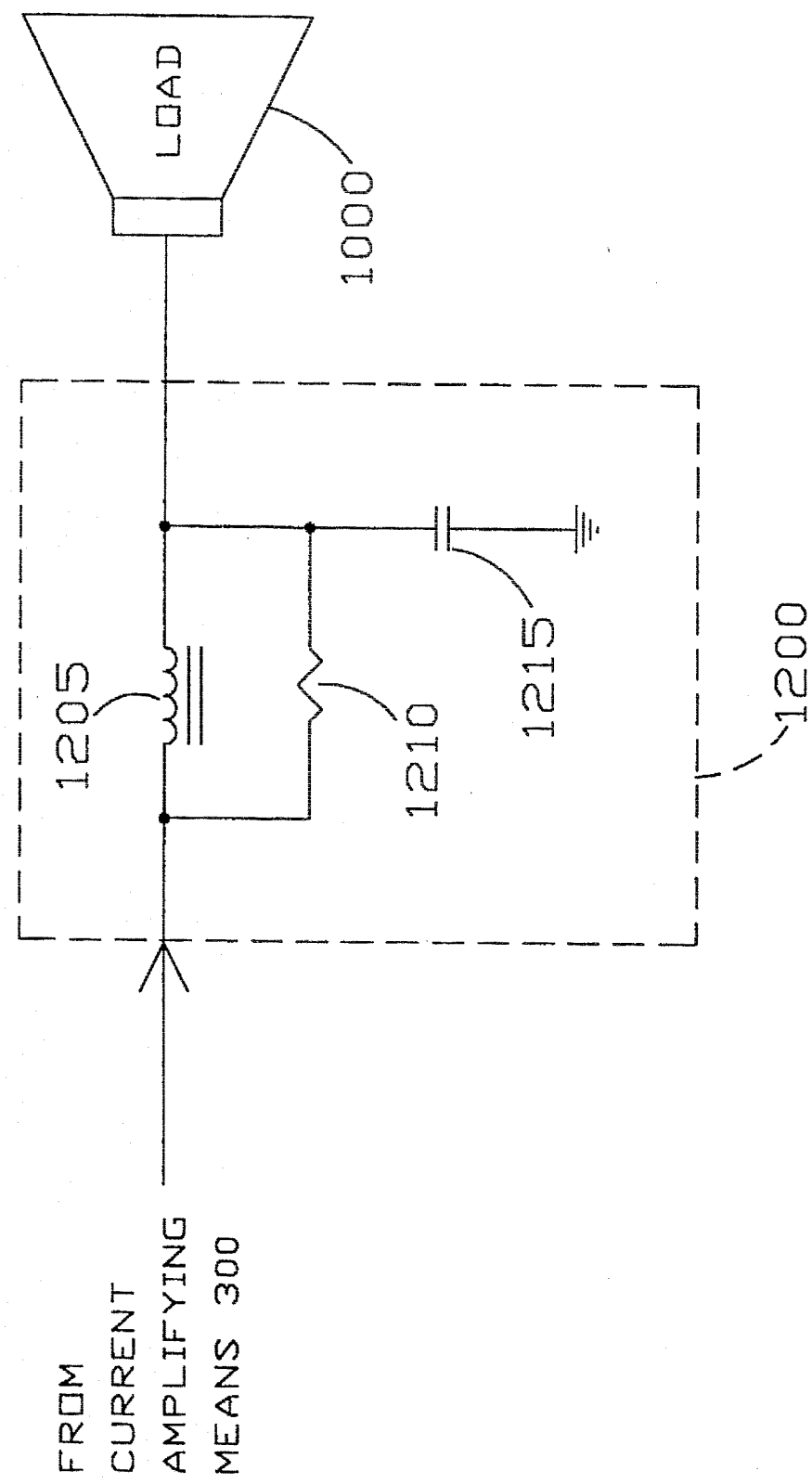
FIG. 9 is a schematic diagram illustrating the low pass filter used in conjunction with the present invention.

In the foregoing description of the invention, reference has been made to the low pass filter 1200 which is interconnected between current amplifying means 300 and load 1000 (see FIGS. 1, 3 and 7). As seen in FIG. 9, low pass filter 1200 comprises an inductor 1205, a resistor 1210 and a capacitor 1215. The time constant of low pass filter 1200 is selected so that it has a cut-off frequency more than five times the audio bandwidth involved. In this way low pass filter 1200 will not adversely affect the frequency response of the linear amplifier within the bandwidth of interest, yet will be effective to further reduce residual pulse noise present at the output of current amplifier means 300.

Since certain changes may be made in the preferred embodiments described above without departing from the scope of the present invention, it is intended that all matter contained in the above description or shown in the accompanying drawings shall be interpreted in an illustrative and not in a limiting sense.

What is claimed is:

1. A linear power amplifier having a pulse density modulated switching power supply comprising:

power supply means for connection to a source of electrical power and adapted to provide (i) a first, relatively high DC voltage, and (ii) a second, relatively low DC voltage;

voltage amplifying means for connection to a signal source and adapted to amplify a first, relatively low voltage signal received from said signal source into a second, relatively high voltage signal;

current amplifying means connected to said voltage amplifying means and adapted to increase the current flow of said second, relatively high voltage signal, as needed, in order to properly drive a load, wherein said current amplifying means are normally powered by said second, relatively low DC voltage supplied by said power supply means; and pulse generating means connected to the line carrying said second, relatively high voltage signal to said load, and to the line supplying power to said current amplifying means, said pulse generating means being adapted to (i) compare the instantaneous voltage amplitude of said second, relatively high voltage signal with the level of the voltage powering said current amplifying means, and (ii) provide fixed duration pulses, at said first, relatively high DC voltage, to power said current amplifying means whenever, and so long as, the voltage amplitude of said second, relatively high voltage signal rises high enough relative to the level of the voltage powering said current amplifying means to cause said current amplifying means to approach saturation.

2. A linear power amplifier according to claim 1 wherein said power supply means comprise a dual polarity power supply.

3. A linear power amplifier according to claim 1 wherein said voltage amplifying means comprise a linear voltage amplifier.

4. A linear power amplifier according to claim 1 wherein said current amplifying means comprise at least two current gain transistors.

5. A linear power amplifier according to claim 1 wherein said pulse generating means are adapted to provide said pulses of first, relatively high DC voltage in sufficient number and with sufficient frequency, and said first, relatively high DC voltage is selected so as to be high enough relative to the voltage amplitude of said second, relatively high voltage signal, to prevent said current amplifying means from reaching saturation.

6. A linear power amplifier according to claim 1 wherein said linear power amplifier further comprises pulse filter means connected between said pulse generating means and said current amplifying means, wherein said pulse filter means are adapted to condition each pulse's profile so as to apply a signal-approximated power waveform to said current amplifying means.

7. A linear power amplifier according to claim 1 wherein said pulse generating means comprise a high speed switch and a power switch, and further wherein said high speed switch is adapted to change states when the voltage amplitude of said second, relatively high voltage signal rises high enough relative to the level of the voltage powering said current amplifying means to cause said current amplifying means to approach saturation, and further wherein said power switch is adapted to provide said pulses of first, relatively high DC voltage to said current amplifying means in response to a change in state of said high speed switch.

8. A linear power amplifier according to claim 1 wherein said pulse generating means comprise a voltage monitor with bi-state impedance, and further wherein said voltage monitor with bi-state impedance is adapted to change impedance states when the voltage amplitude of said second, relatively high voltage signal rises high enough relative to the level of the voltage powering said current amplifying means to cause said current amplifying means to approach saturation.

9. A linear power amplifier according to claim 8 wherein said pulse generating means comprise a high speed switch adapted to change state in response to a change in the impedance state of said voltage monitor with bi-state impedance.

10. A linear power amplifier according to claim 9 wherein said high speed switch comprises a Schmitt trigger.

11. A linear power amplifier according to claim 10 wherein said pulse generating means further comprise a power switch adapted to provide pulses of said first, relatively high DC voltage to said current amplifying means in response to a change in state of said high speed switch.

12. A linear power amplifier according to claim 11 wherein said power switch comprises a power MOSFET.

13. A linear power amplifier according to claim 1 wherein said amplifier further comprises a low pass filter interconnected between said current amplifying means and said load.

14. A method for operating a linear power amplifier of the sort comprising (i) power supply means for connection to a source of electrical power and adapted to provide a first, relatively high DC voltage and a second, relatively low DC voltage; (ii) voltage amplifying means for connection to a signal source and adapted to amplify a first, relatively low voltage signal received from said signal source into a second, relatively high voltage signal; and (iii) current amplifying means connected to said voltage amplifying means and adapted to increase the current flow of said second, relatively high voltage signal, as needed, in order to properly drive a load, wherein said current amplifying means are normally powered by said second, relatively low DC voltage supplied by said power supply means;

wherein said method comprises the steps of:
(1) comparing the instantaneous voltage amplitude of said second, relatively high voltage signal with the level of the voltage powering said current amplifying means;
(2) providing a fixed duration pulse, at said first, relatively high DC voltage, to power said current amplifying means if the voltage amplitude of said second, relatively high voltage signal is high enough relative to the level of the voltage powering said current amplifying means to cause said current amplifying means for approach saturation; and
(3) returning to Step 1.

15. Pulse generating means for use in a linear power amplifier of the sort comprising: power supply means for connection to a source of electrical power and adapted to provide (i) a first, relatively high DC voltage, and (ii) a second, relatively low DC voltage; voltage amplifying means for connection to a signal source and adapted to amplify a first, relatively low voltage signal received from said signal source into a second, relatively high voltage signal; and current amplifying means connected to said voltage amplifying means and adapted to increase the current flow of said second, relatively high voltage signal, as needed, in order to properly drive a load, wherein said current amplifying means are normally powered by said second, relatively low DC voltage supplied by said power supply means;

said pulse generating means being connected to the line carrying said second, relatively high voltage signal to said load, and to the line supplying power to said current amplifying means, and said pulse generating means being adapted to (i) compare the instantaneous voltage amplitude of said second, relatively high voltage signal with the level of the voltage powering said current amplifying means, and (ii) provide fixed duration pulses, at said first, relatively high DC voltage, to power said current amplifying means whenever, and so long as, the voltage amplitude of said second, relatively high voltage signal rises high enough relative to the level of the voltage powering said current amplifying means to cause said current amplifying means to approach saturation.

* * * * *